(12) United States Patent
Sato et al.

(10) Patent No.: US 8,039,108 B2
(45) Date of Patent: Oct. 18, 2011

(54) MEMBER FOR CAVITATION EROSION RESISTANCE AND METHOD FOR MANUFACTURING SAME

(75) Inventors: Takayasu Sato, Toyota (JP); Takaaki Kanazawa, Nisshin (JP); Masaki Nanahara, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 776 days.

(21) Appl. No.: 11/919,737

(22) PCT Filed: Jan. 26, 2007

(86) PCT No.: PCT/IB2007/000251
§ 371 (c)(1),
(2), (4) Date: Nov. 1, 2007

(87) PCT Pub. No.: WO2007/091139
PCT Pub. Date: Aug. 16, 2007

(65) Prior Publication Data
US 2009/0098361 A1  Apr. 16, 2009

(30) Foreign Application Priority Data
Feb. 10, 2006 (JP) ................... 2006-034100

(51) Int. Cl.
*C23C 14/06* (2006.01)
(52) U.S. Cl. ........ 428/408; 427/577; 428/336; 428/469; 428/698
(58) Field of Classification Search ............... 428/336, 428/408, 469, 698; 427/577
See application file for complete search history.

(56) References Cited

U.S. PATENT DOCUMENTS

| | | | | | |
|---|---|---|---|---|---|
| 4,842,937 | A | * | 6/1989 | Meyer et al. | 428/408 |
| 5,249,554 | A | * | 10/1993 | Tamor et al. | 428/469 |
| 5,368,939 | A | * | 11/1994 | Kawamura et al. | 428/698 |
| 5,662,999 | A | * | 9/1997 | Taniguchi et al. | 428/408 |
| 6,022,622 | A | * | 2/2000 | Domoto et al. | 428/698 |
| 6,077,572 | A | * | 6/2000 | Hopwood et al. | 427/577 |
| 6,087,025 | A | * | 7/2000 | Dearnaley et al. | 428/213 |
| 6,110,329 | A | * | 8/2000 | Holleck et al. | 204/192.15 |
| 6,340,245 | B1 | * | 1/2002 | Horton et al. | 428/216 |
| 6,372,303 | B1 | * | 4/2002 | Burger et al. | 427/577 |
| 6,726,993 | B2 | * | 4/2004 | Teer et al. | 428/408 |
| 6,740,393 | B1 | * | 5/2004 | Massler et al. | 428/469 |

(Continued)

FOREIGN PATENT DOCUMENTS
DE   100 26 477   11/2001
(Continued)

OTHER PUBLICATIONS
International Search Report.
(Continued)

*Primary Examiner* — Archene Turner
(74) *Attorney, Agent, or Firm* — Finnegan, Henderson, Farabow, Garrett & Dunner, LLP

(57) ABSTRACT

A member (1) resistant to erosion by cavitation on which an amorphous carbon film coating is formed on a surface of a base material has at least a first amorphous carbon film coating (4) having a plurality of columnar structures (4a) on the surface of the base material (2), and a second amorphous carbon film coating (5) having a plurality of granular structures (5a) deposited with no orientation on the surface of the first amorphous carbon film coating (4).

11 Claims, 12 Drawing Sheets

U.S. PATENT DOCUMENTS

| | | | |
|---|---|---|---|
| 6,881,475 B2 * | 4/2005 | Ohtani et al. | 428/336 |
| 6,962,751 B2 * | 11/2005 | Fukui et al. | 428/408 |
| 7,160,616 B2 * | 1/2007 | Massler et al. | 428/408 |
| 7,323,219 B2 * | 1/2008 | Teer | 427/577 |
| 7,416,786 B2 * | 8/2008 | Oda et al. | 428/408 |
| 2004/0069466 A1 | 4/2004 | Blangetti et al. | |
| 2004/0200599 A1 | 10/2004 | Bradley | |

FOREIGN PATENT DOCUMENTS

| | | | |
|---|---|---|---|
| DE | 100 56 241 | | 5/2002 |
| JP | 01-018991 | * | 1/1989 |
| JP | 11-22656 | | 1/1999 |
| JP | 2002-088465 | * | 3/2002 |
| JP | 2003-14121 | | 1/2003 |
| JP | 2003-207001 | | 7/2003 |

OTHER PUBLICATIONS

Written Opinion of the ISR.

J. H. Ouyang, et al., "Friction and wear characteristics of Ti-containing diamond-like carbon coating with an SRV tester at high contact load and elevated temperature," *Surface Coatings & Tech.*, 195 (2005), pp. 234-244.

Notification of Reason(s) for Refusal for JP Appl. No. 2006-034100 dated Nov. 2, 2010.

* cited by examiner

FIG.11
| | EXAMPLE 3 | COMPARATIVE EXAMPLE 7 |
|---|---|---|
| HARDNESS (DH) | 2177 | 1549 |
| DAMAGED SURFACE AREA RATIO(%) | 0.56 | 69.5 |
| BEFORE TEST | 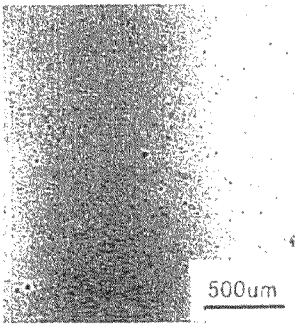 | 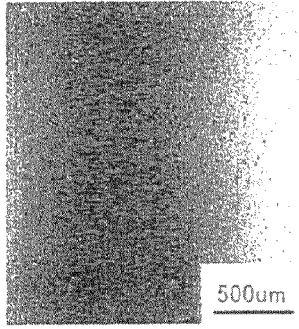 |
| AFTER TEST | 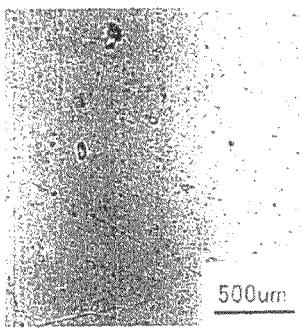 | 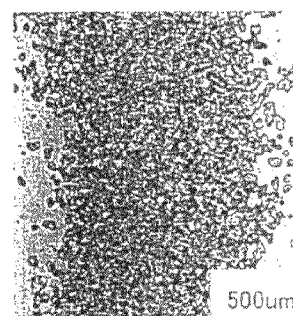 |

FIG. 14

| APPLICATION SCOPE | TARGET EQUIPMENT OR PARTS | REMARKS |
|---|---|---|
| FUEL INJECTION | SERIAL FUEL INJECTION PUMP | DIESEL |
| | SERIAL FUEL INJECTION PIPE | |
| | DISTRIBUTED FUEL INJECTION PUMP | |
| | COMPACT HIGH-PRESSURE DIRECT FUEL INJECTION PUMP | |
| | COMPACT HIGH-PRESSURE DIRECT FUEL INJECTION PIPE | |
| | COMMON RAIL INJECTION HIGH-PRESSURE GEAR PUMP | |
| | COMMON RAIL FUEL INJECTION PRESSURE VALVE | |
| | EFI EJECTOR | GASOLINE |
| | EFI FUEL PUMP | |
| | INJECTION BALL VALVE ROD | |
| ENGINE | E/G BEARING METAL | |
| | CYLINDER GASKET | |
| ENGINE PARTS | THROTTLE BODY THERMO-ELEMENT | |
| | WATER PUMP | |
| | COOLING WATER PIPE | |
| | BELT TENSIONER VALVE | |
| CONTROL | BRAKE BOOSTER VALVE | |
| | BRAKE VALVE | |
| STEERING | POPETTE VALVE | |
| | P/S PUMP FLOW CONTROL VALVE | |
| | P/S PUMP BEARING METAL | |
| SUSPENSION | SHOCK ABSORBER | |
| POWER TRAIN | AT FRICTION MATERIAL | |
| | AT OIL COOLER | |
| | AT OIL PUMP | |

MEMBER FOR CAVITATION EROSION RESISTANCE AND METHOD FOR MANUFACTURING SAME

BACKGROUND OF THE INVENTION

1. Field of the Invention

The present invention relates to a member in which an amorphous carbon film coating is formed on the surface of a base material that contacts a fluid and to a method of manufacturing same. More particularly, it relates to art enabling the reduction of erosion caused by cavitation that may occur within the fluid.

2. Description of the Related Art

In hydraulic equipment in a vehicle, because an operating fluid flows at high speed, the parts of the operating fluid having a low pressure vaporize in the region of valves and the like that are part of the hydraulic equipment, and vapor bubbles (cavitation bubbles) occur. The phenomenon of cavitation occurs, in which these bubbles collapse and disappear in a short period of time (several microseconds to several tens of microseconds). When such cavitation bubbles collapse, a shock wave as much as several GPa is generated. By the action of this shock wave on the surfaces of valves, damage that is known as erosion occurs in the form of depressions that appear to be parts where the surface is dug into. As a result, the hydraulic equipment might exhibit vibration and a decrease in performance.

In order to suppress erosion caused by this type of cavitation, the surfaces of the valves that come into contact with the operating fluid may be treated with Tufftride. Also, the provision of a DLC (diamond like carbon) film coating on either or both of the surface of a check ball found in a check valve and the surface of the annular ball sheet that receives the check ball has been described in Japanese Patent Application Publication No. JP-A-2003-207001.

In recent years, however, with a shift to hybrid vehicles, new systems that regenerate the energy of the vehicle when running have been added. As a result, linear valves and the like that are found in such vehicles experience an increased number of operations, and there is a trend toward more operating fluid passing through these valves. Also, cavitation erosion of the surfaces of the valves that contact the operating fluid occurs more easily. For this reason, it is not possible to sufficiently suppress erosion by the current situation being one in which, although Tufftride treating is done to the surfaces of ferrous materials, and simply providing a coating of amorphous carbon (DLC film coating). In particular, depending upon the film forming conditions, there is a large difference in the characteristics, such as the structure of the film, the thickness of the film, the adhesion, the surface hardness, $SP^2$ (graphite structure)/$SP^3$ (diamond structure) ratio, hydrogen concentration, and metal additive concentration. Therefore, it is not possible to say that an amorphous carbon film coating has superior cavitation erosion resistance characteristics. Additionally, a valve coated by an amorphous carbon film coating (DLC film coating) in such an environment cannot be said to have sufficient adhesion, and there is a risk of it peeling.

SUMMARY OF THE INVENTION

The present invention provides a film coating that improves resistance of a member to erosion by cavitation, while achieving with good adhesion of the film coating oh the surface.

The mode of erosion by cavitation results from the repeated stressing of the surface of a member by shock waves caused by cavitation, which causes fatigue in the vicinity of the surface, and generates cracks from the weak parts in the parts of the structure making up the surface (the grain boundary part). Additionally, the growth of the crack causes a damage mode in which the member continues to erode. In order to improve the resistance of the member to cavitation erosion, the surface hardness of the member must be sufficiently hard to tolerate the shock waves from cavitation. One such material having an appropriate surface hardness is amorphous carbon material.

A film coating made of an amorphous carbon material ideally possesses the two functions of (1) bonding the film coating and the base material and (2) reducing the damage of the grain boundaries (boundaries of the structure) caused by the shock waves. It has been determined that an amorphous carbon film coating having a structure of columns arranged in a regular manner on the surface of the base material, achieves a uniform bond between the film coating and the base material, and an amorphous carbon film coating, having a fine structure in which there is no orientation, it is possible to reduce the grain boundary damage. Thus, by laminating amorphous carbon film coatings having these two different structures, it is possible to satisfy the two functions simultaneously.

A first aspect of the present invention relates to a member that is treated to improve resistance to erosion by cavitation in which the member contacts with fluid, and an amorphous carbon film coating is formed on the surface of a base material. The member has at least a first amorphous carbon film coating, having a plurality of columnar structures (columnar microstructure), on a surface of the base material, and a second amorphous carbon film coating, having a plurality of granular structures (granular microstructure), deposited with no particular orientation on the surface of the first amorphous carbon film coating.

In the present invention, the phrase "plurality of columnar structures" refers to a group of structures made from an amorphous carbon material having columnar shapes and extending in a regular manner and substantially perpendicularly (in a single direction) to the surface of a hard layer. The phase "plurality of granular structures deposited with no particular orientation" refers to a group of structures made from an amorphous carbon material having granular shapes and being deposited without any particular orientation.

According to the member for cavitation erosion resistance of the present invention, by providing a first amorphous carbon film coating having a plurality of columnar structures (columnar microstructure) on the surface of a base material, it is possible to improve the adhesion of the first amorphous carbon film coating to the base material, and the adhesion between the first amorphous carbon film coating and the second amorphous carbon film coating. In addition, even if the shock waves of cavitation bubbles cause waviness on the surface of the base material, because the film coating tracks to the waviness, these film coatings do not peel. Additionally, by providing a second amorphous carbon film coating having a plurality of granular structures deposited with no orientation, because each of these granular structures falls away individually, it is possible to reduce the cavitation erosion of the member.

The surface hardness of the second amorphous carbon film coating can be established by forming the film with an Hv value in the range from 200 to 8000. However, from the standpoint of ease in forming the film, it is preferable that the surface hardness Hv be from 1000 to 3000. Thus, additive elements such as Si, Ti, Cr, Mo, Fe, W, B, N and the like may be added into the first and second amorphous carbon film coatings. By adding such elements, it is possible to adjust the surface hardness of the film coating. These elements may be added as a gradient component along the thickness direction of the first and second film coatings. By adding such an element, it is possible to adjust the film coating characteristics so that the film coating is appropriate for the usage environment.

The member treated to improve resistance against erosion by cavitation may have a multilayer structure in which the first and second amorphous carbon film coatings are repeatedly formed. In this case, it is preferable that the second amorphous carbon film coating of the multilayer film be formed so as to come into contact with the fluid.

Additionally, it is preferable that the average grain diameter of the granular structures of the member be 5 to 500 nm. By depositing such fine nano-order granular structures, it is possible to form a tightly packed film. Even in the event that granular structures of the second amorphous carbon film coating fall away because of shock waves caused by cavitation, the overall damage is small. For this reason, it is possible to further improve the resistance of the member against erosion by cavitation.

Additionally, the surface layer of the base material, on which the amorphous carbon film is formed, may be hardened. In this manner, by hardening the surface layer of the base material, it is possible to reduce pitting of the surface of the base material caused by shock waves due to cavitation bubbles. For this reason, it becomes possible to improve the leakage resistance of a flow valve, and it is possible, for example, to improve the control characteristics of precision fluid equipment such as servo valves.

In the present invention, the term "hardened layer" means the surface of the base material that has been subjected to a hardening process. For example, when the base material is a ferrous material, the surface layer may be hardened by carburizing or nitriding or the like, or the surface layer may also be hardened by quenching obtained by flame hardening, RF hardening or the like. The surface of the base material may be made of a ferrous material. The hardened layer may also be any one of a nitrided layer, a carbonitrided layer, and a oxynitrided layer. Of these layer types, the nitrided layer is more preferable as the hardened layer. The thickness and surface hardness of the hardened layer differ depending upon the type of steel of the base material. However, from the standpoint of ease of manufacturing, it is preferable that the nitrided layer thickness be 50 μm, and that the surface hardness Hv thereof be approximately 1000. The same effect can be achieved if the base material itself has such as surface hardness.

Compared with high-speed steel and dice steel, in which case the base material itself is hard, the hardened layer can be formed less expensively. A treated surface that has been subjected to such nitriding treatment may have an appropriate surface roughness in the sub-micron order. For this reason, when a film is formed on the treated surface, because of an anchoring effect, it is possible to improve the adhesion of the film.

Additionally, an intermediate film layer that includes an element selected from the group consisting of Cr, Ti, W, Ni, Si, Al, and combinations thereof, may be provided between the hardened surface layer and the first amorphous carbon film coating. By providing such intermediate film, it is possible to improve the adhesion between the base material and the first amorphous carbon film coating. Additionally, forming an intermediate film on the surface of a base material that has been hardened through nitridation as noted above, causes nitrogen atoms included in the hardened layer to migrate to the intermediate film when the intermediate film is formed.

Thus, it is possible to improve the adhesion between the intermediate film and the hardened layer. That is, because even at a low temperature nitrogen atoms that have been dissolved into the solid hardened layer dissolve in the intermediate film, more easily than carbon atoms dissolved by carburizing, it is possible to improve the adhesion more effectively. Additionally, because nitridization of the base material may be carried out at a lower temperature than carburization, it is possible to perform coating of the layer surface immediately after treating, without causing deformation or softening of part dimensions, and the like.

Additionally, a gradient film may be formed between the primer film and the first amorphous carbon film coating, in which the composition of the gradient film changes going from the first amorphous carbon film coating to the primer film. By forming this type of gradient film, it is possible to further increase the adhesion of the amorphous carbon film coating. Also, although this gradient film is formed between the primer film and the first amorphous carbon film coating, it is also possible to improve the adhesion of the first and second amorphous carbon film coatings by disposing the gradient film only between the base material and the first amorphous carbon film coating in place of the intermediate film.

It is preferable that the thickness of the first amorphous carbon film coating of this kind of member be 0.2 to 0.4 μm, and that the thickness of the second amorphous carbon film coating be 0.5 to 4.5 μm. The thinner is the thickness of the first amorphous carbon film coating the better is the adhesion of the film coating with respect to shock waves of cavitation, and from the standpoint of film forming art, the minimum thickness range for forming a uniform film such as this is approximately 0.2 to 0.4 μm. Increasing the thickness of the second amorphous carbon film coating provides better resistance to erosion by cavitation. However, if the thickness of the film is excessive when the second amorphous carbon film coating is formed, compression stress on the amorphous carbon film coating may cause the film to peel from the base material. For this reason, it is preferable that the film thickness range enabling the formation of this film coating be 0.5 to 4.5 μm. Also, in order to improve the resistance to erosion by cavitation, it is desirable that the minimum thickness be 2.0 μm and above. As a result, it is preferable that thickness of the film be 2.0 to 4.5 μm.

A second aspect of the present invention relates to a method of manufacturing a member having improved resistance to erosion by cavitation in which the member contacts with fluid, and an amorphous carbon film coating is formed on the surface of a base material. The method of manufacturing a member has a step of forming a first amorphous carbon film coating comprising a plurality of columnar structures on the surface of the base material, and a step of forming a second amorphous carbon film coating comprising a plurality of granular structures deposited on a surface of the first amorphous carbon film coating without orientation.

According to this manufacturing method, in an environment in which cavitation occurs, the improved resistance of the manufactured member to erosion by cavitation enables the reduction of cavitation erosion bonding the film coating.

There is no particular method by which the first and second amorphous carbon film coating must be formed. However, a suitable method for forming the first amorphous carbon film coating may be a physical vapor deposition method (PVD) and the second amorphous carbon film coating may be formed through a plasma chemical vapor deposition method (plasma CVD). By forming the films by these film deposition methods, it is possible to more easily obtain a plurality of columnar structure of the first amorphous carbon film coating and a plurality of granular structures deposited without orientation in the second amorphous carbon film coating. PVD methods include methods such as vacuum vapor deposition, ion plating, and sputtering, and by using such methods it is possible to bond the first amorphous carbon film coating at a low film forming temperature (250° C. or lower).

In the second amorphous carbon film coating it is additionally preferable that the average grain diameter of the granular structures be formed so as to be 5 to 500 nm. By making this grain diameter, it is possible to form a tightly packed film. For example, even if individual granular structures of the second amorphous carbon film coating fall away one by one because of cavitation shock waves, the overall damage is slight. For this reason, it is possible to improve the cavitation erosion resistance characteristics. Also, by forming the second amorphous carbon film coating using the above-described plasma CVD method, it is particularly possible to manufacture granular structures with a diameter in this range.

The surface layer of the base material may be hardened before forming the first amorphous carbon film coating. By forming this kind of hardened layer, it is possible to reduce waviness in the surface of the base material due to shock waves caused by cavitation. Also, the surface layer may be hardened by, for example, nitriding, carbonitriding, or oxynitriding. By performing this type of processing, it is possible to inexpensively obtain a film with good adherence. For example, examples of such nitriding processing (including soft nitriding) include Tufftriding (salt bath nitriding), gas nitriding, plasma nitriding, ion nitriding, radical nitriding, and the like. Furthermore, the nitriding may also be processing in which a ferrous nitride ($\epsilon Fe_{2-3}N$, $\gamma'Fe_4N$) does not occur on the surface of the base material, with nitrogen atoms themselves being solid-dissolve.

Before the step of forming the first amorphous carbon film coating, it is preferable that the surface of the base material include a ferrous material and that the primer film includes an element selected from the group consisting of Cr, Ti, W, Ni, Si, Al, or combinations thereof, be provided on the surface of the hardened layer. In particular, when forming an intermediate film of a metallic element, nitrogen atoms dissolved into the hardened surface layer may diffuse into the primer film, enabling the adhesion of both to be further improved.

Additionally, a gradient film may be further provided between the primer film and the first amorphous carbon film coating. In the gradient film, the additive element is added so that the composition additive element making up the primer film changes as the first amorphous carbon film coating approaches the intermediate film. By doing this, it is possible to further improve the adhesion of the amorphous carbon film coating. Considering the bonding with the first amorphous carbon film coating, the component of the primer film may be formed by sputtering, using carbon and the gradient film as a target.

Additionally, it is preferable that the first amorphous carbon film coating be formed so as to have a thickness of 0.2 to 0.4 m, and that the second amorphous carbon film coating be formed so as to have a thickness of 0.5 to 4.5 μm. By selecting these film thickness ranges, it is possible to improve the adhesion with respect to the cavitation shock waves, and the suppress cavitation erosion. Also, it is more preferable that the thickness of the second amorphous carbon film coating be 2.0 to 2.5 μm.

According to the present invention, by forming a plurality of amorphous carbon film coatings having different structures (microstructures) on the surface of the base material, in an environment in which cavitation occurs, it is possible to reduce cavitation erosion, while bonding the amorphous carbon film coatings formed on the surface.

BRIEF DESCRIPTION OF THE DRAWINGS

The foregoing and further objects, features, and advantages of the invention will become apparent from the following descriptions of preferred embodiments with reference to the accompany drawings, wherein like numerals are used to represent like elements and wherein:

FIG. 11 is a drawing that describes the cavitation test results of embodiment 3 and comparative examples 7;

FIG. 14 is a table showing equipment and parts in which the member for cavitation erosion resistance is applied.

DETAILED DESCRIPTION OF THE PREFERRED EMBODIMENTS

The member for cavitation erosion resistance according to the present invention is described below based on embodiments.

EXAMPLE 1

Figure 1:
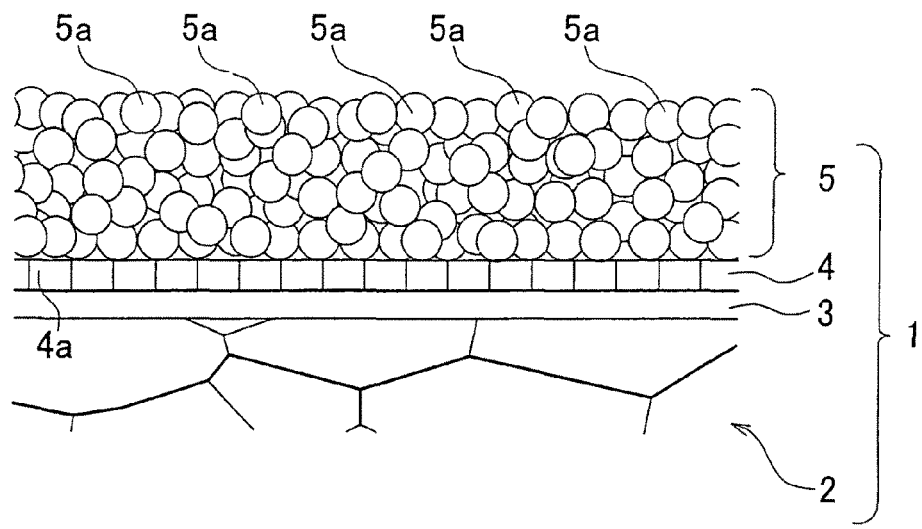
FIG. 1 is a cross-sectional view showing a schematic representation of a member for cavitation erosion resistance according to a first embodiment of the present invention.

<Manufacturing of Test Samples>
The test sample of example 1, test sample W, was prepared of a member for cavitation erosion resistance 1 having, on the surface of a base material 2 such as shown in FIG. 1, an primer (gradient) film 3 having chromium as the main material, a first amorphous carbon film coating (first DLC film coating) having a plurality of columnar structures 4a on the surface of the intimately contacting film 3, and a second amorphous carbon film coating (second DLC film coating) 5 having a plurality of granular structures deposited with no orientation on the surface of the first amorphous carbon film coating 4.

Figure 2:
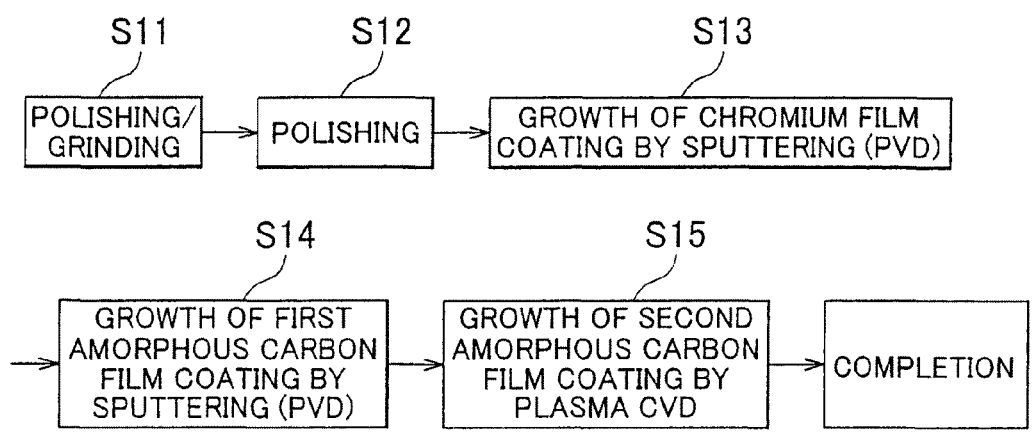
FIG. 2 is a flow diagram for describing a method of manufacturing the member for cavitation erosion resistance of FIG. 1.

In terms of the specific manufacturing procedure, the test sample W was manufactured following the procedure as shown in FIG. 2. First, a stainless steel tube having a step and having a diameter of 25 mm and a thickness of 12 mm (JIS standard: SUS303) was prepared as the base material 2 and the surface thereof was polished (S11). Next, the surface of this base material 2 was treated by ion bombardment at a temperature of 150° C. (S12). After this, sputtering was performed for 20 minutes using a chromium target, to form an intermediate film coating having a thickness of 0.3 µm. When this was done, although the part making contact with the substrate is pure chromium, a gradient composition was imparted so that the outermost surface becomes an DLC (S13).

Then the base material onto which is formed the chromium film coating is processed using a carbon target and acetylene in a sputtering method, which is a physical vapor deposition method (PVD), for a growth time of 30 minutes, so as to form a first amorphous carbon film coating having a plurality of columnar structures 4a (S14). Additionally acetylene gas is used in plasma chemical vapor deposition (plasma CVD) so as to form a second amorphous carbon film coating having a plurality of granular structures 5a deposited without orientation on the surface onto which the first amorphous carbon film coating is formed (S15). At this point, although surface polishing is not done after the forming of the second amorphous carbon film coating, polishing may be done as required.

<Cavitation Test>

Figure 3A:
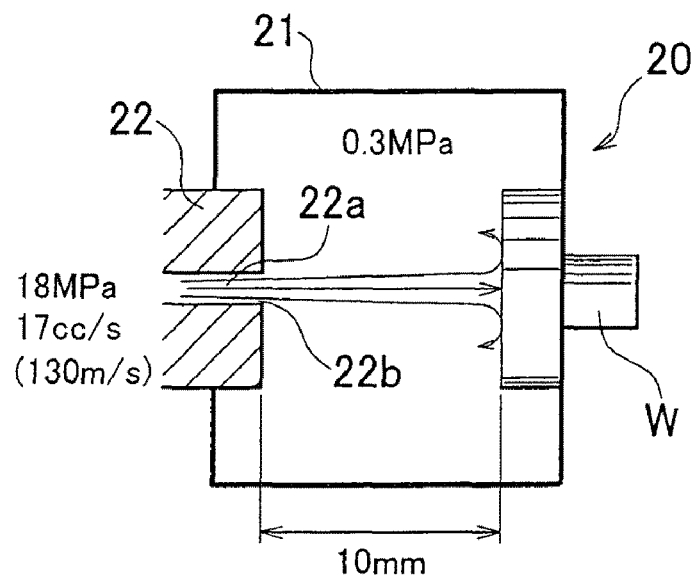
FIG. 3a is a drawing showing the configuration of the jet cavitation tester.

The test sample W is placed in the vessel 21 of jet cavitation tester (ASTM standard, cavitation material tester) 20 such as shown in FIG. 3a. The tester 20 is filled with ion exchange water at a pressure of 0.3 MPa, and a nozzle 22 is placed so that the end 22b of the 0.4-mm-diameter ejection hole 22a is at a distance of 10 mm from the surface of the second amorphous carbon film coating of the test sample W. Ion exchange water is ejected from this ejection hole 22a at a pressure of 18 MPa and a flow rate of 17 cc/s (130 m/s) for 300 seconds to cause cavitation at the surface of the test sample W. The cavitation of the test sample W was evaluated.

[Test Evaluation Method 1: Measurement of the Damaged Surface Area Using a Metallurgical Microscope]

Figure 4:
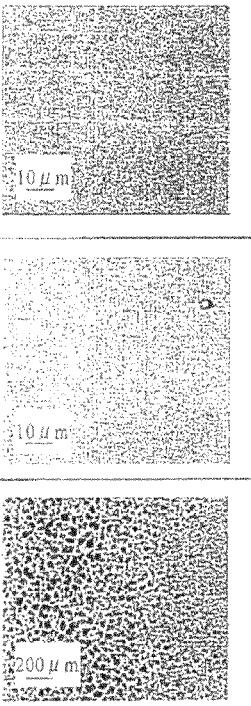
FIG. 4 shows photographs taken by a metallurgical microscope of the surface of test samples of example 1 and comparative examples 1 and 2.

The surface of the test sample was observed using a metallurgical microscope before and after the cavitation test. Also, the damaged surface area was measured from photos taken when performing metallurgical microscope observations, and the damaged surface area ratio was calculated as (damaged surface area ratio)=(damaged surface area)/(overall surface area)×100. The results are shown in FIG. 4.

[Test Evaluation Method 2: Observation of the Surface Using Metal and Scanning Electron Microscopes]

Figure 3B:
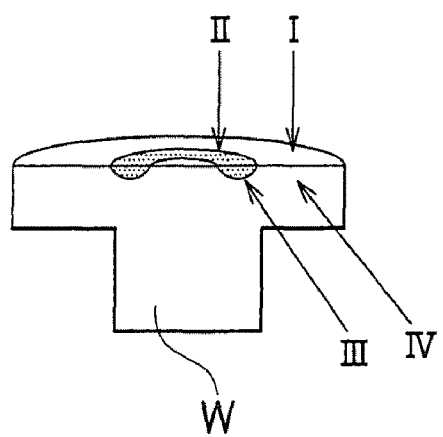
FIG. 3b is a drawing describing the test samples observed using a metallurgical microscope or an electron microscope.

As shown in FIG. 3b, the surface normal area, over which damage to the test sample was not observed after the cavitation test (I part) and the surface damaged area over which damage to the test sample was observed (II part) were observed under magnification, using the metallurgical microscope. The results are shown in sections I to III of FIG. 4. In FIG. 4, I and II are the results of observing with a metallurgical microscope magnification of 1000 times, and III is the result of observing with a metallurgical microscope magnification of 50 times.

Additionally, as shown in FIG. 3b, the test sample was cut along the thickness direction of the amorphous carbon film coating. Using a metallurgical microscope at a magnification of 1000 times, observation was performed of the cross-sectional damaged area (III part) of the cut surface that was caused by cavitation. The results are shown at IV in FIG. 4.

[Test Evaluation Method 3: Measurement of the Surface Roughness of the Test Sample]

Figure 5A:
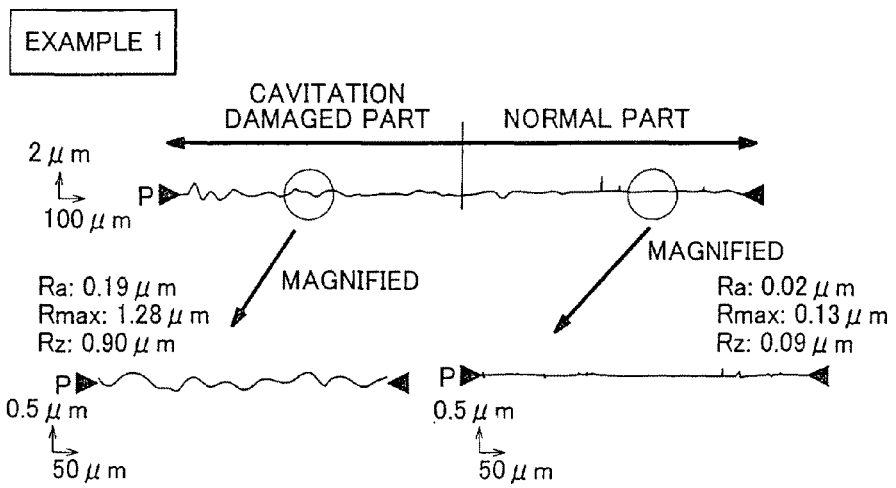
FIG. 5a is a drawing that shows the measurement result of measurements of the surface hardness of the example 1.

A surface roughness tester was used to measure the surface roughness of the surface normal area (I part) and the surface damaged area (II part) shown in FIG. 3b. The results are shown in FIG. 5a and in Table 1 that follows.

COMPARATIVE EXAMPLE 1

Figure 5B:
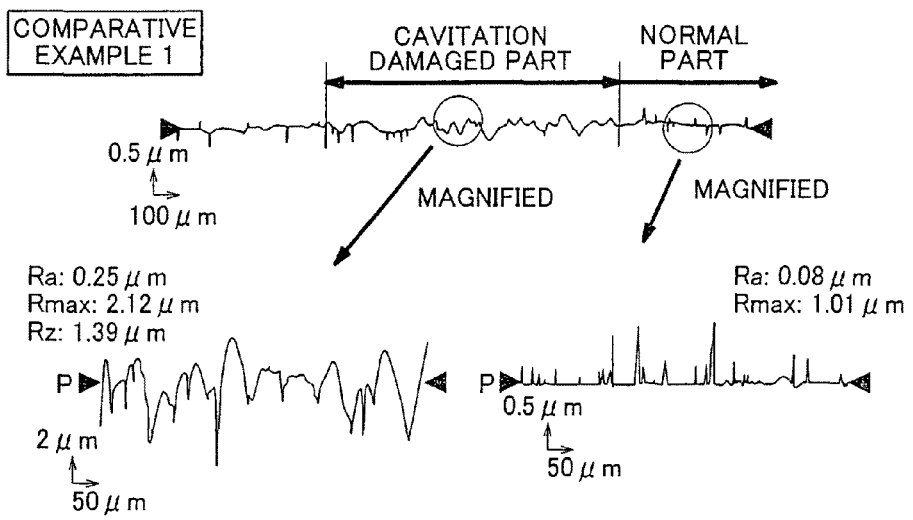
FIG. 5b is a drawing that shows the measurement results of measurements of the surface hardness of comparative example 1.

The same base material as example 1 was prepared and ion bombardment was performed under the same conditions as in example 1, and sputtering was used to form a chromium film coating on the surface thereof, after which an amorphous carbon film coating was formed. That is, the test sample of comparative example 1 differs from example 1 in that the second amorphous carbon film coating is not formed by plasma CVD. An evaluation test was performed in the same manner as with example 1. The results are shown in FIG. 4. The surface roughness measurement results are shown in FIG. 5b and Table 1.

COMPARATIVE EXAMPLE 2

The same base material as in example 1 was prepared and the base material was pre-heated to 350° C. for 75 minutes. Tufftride treating (salt bath nitriding) was performed at 570° C. for 60 minutes in order to achieve a surface hardness Hv of 1000 and a layer thickness of 25 µm, thereby forming a nitrided layer (hardened layer) on the surface of the base material 2. After treating the heated base material was cooled (oil cooling at 120° C. for 5 minutes). Then evaluation tests were performed in the same manner as for example 1. The results are shown in FIG. 4.

TABLE 1

|  | Normal Part | | Damaged Part | |
| --- | --- | --- | --- | --- |
|  | Example 1 | Comparative Example 1 | Example 1 | Comparative Example 1 |
| Center line average roughness (Ra) | 0.02 µm | 0.08 µm | 0.19 µm | 0.25 µm |
| Maximum roughness (Rmax) | 0.13 µm | 1.01 µm | 1.28 µm | 2.12 µm |
| 10-point average roughness (Rz) | 0.09 µm | — | 0.9 µm | 1.39 µm |

(Results 1: Surface Damage Results)

As shown in FIG. 4, the test sample of example 1 exhibited almost no surface damage after the cavitation test, the damaged surface area ratio of example 1 being less than 1%, which is small compared with comparative examples 1 and 2.

(Results 2: Surface Condition Results)

As shown at III of FIG. 4 and by FIG. 5, the surface in the damage part caused by cavitation of the test samples of example 1 and comparative example 1 showed a plurality of surface wavinesses resembling depressions. As shown in FIG. 5 and Table 1, the surface roughness in the surface damaged area of example 1 was small compared to that of comparative example 1.

(Observation 1: Prediction of Surface Damage)

Because the second amorphous carbon film coating such as on the surface of the test sample of example 1 is a group of structures (granular structures) made from granular amorphous carbon materials deposited with no particular orientation, even if shock waves from cavitation bubbles act on the film coating surface thereof, each individual granular structure is damaged one by one. Because of this, damage does not extend to the first amorphous carbon film coating, and the damaged surface area ratio of the surface of the test sample is small, it being thought that it is possible to have cavitation erosion resistance characteristics over a long period of time.

In contrast, in the case of the comparative example 1 test sample, the plurality of columnar structures forming the amorphous carbon film coating formed on the surface of the test sample are formed perpendicular to the surface of the base material. For this reason, when shock waves from cavitation bubbles act on the surface of this film coating, the columnar structures themselves are damaged and the surface of the base material is exposed. Because this occurs, it is thought that the damaged surface area ratio of the surface of the test sample becomes large. Additionally, it is thought that, in the case of the test sample of comparative example 2, because the joining of the grains in the metal is weaker than between the columnar structures of the comparative example 1, there is a further increase in the size of the metal, so that the damaged surface area ratio is larger than that of comparative example 1.

(Observation 2: Prediction of Surface Waviness)

Figure 6A:
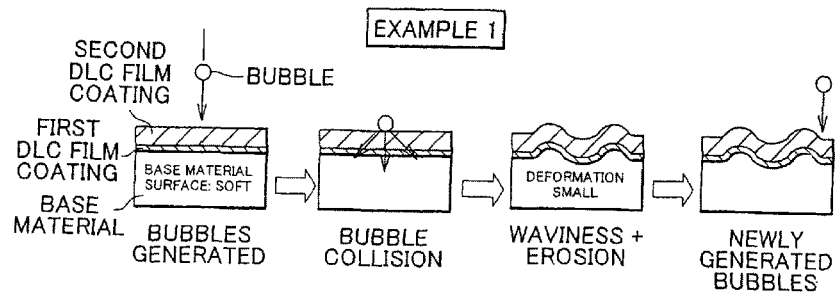
FIG. 6a to 6c are drawings for describing the mechanism of the occurrence of surface waviness caused by cavitation.
Figure 6B:
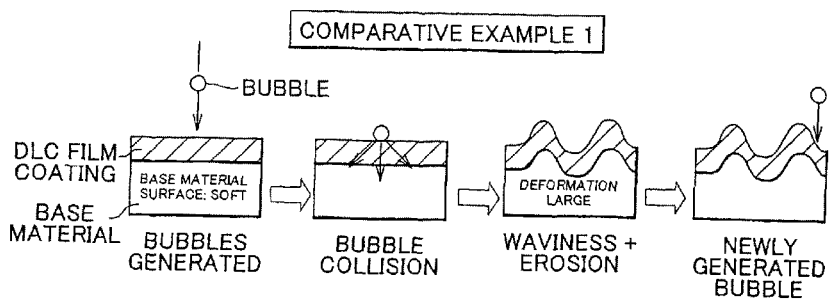

As shown at III in FIG. 4, a plurality of surface wavinesses resembling depressions occurred in the surfaces of the test samples of example 1 and comparative example 1. It is thought that the reason for this is that, as shown in FIG. 6*a* and FIG. 6*b*, cavitation bubbles occur, and the energy of the shock waves at the collisions of the bubbles with the test sample affects the test sample up to the base material, and as a result, along with erosion of the film coating surface, there is deformation that extends to the base material surface, which is an underlayer that is softer than the film coating, thereby causing waviness in the surface of the test sample. Also, it is thought that newly occurring cavitation bubbles repeat this phenomenon, so that the surface roughness increases in the damaged area in comparison to the normal area.

Figure 6C:
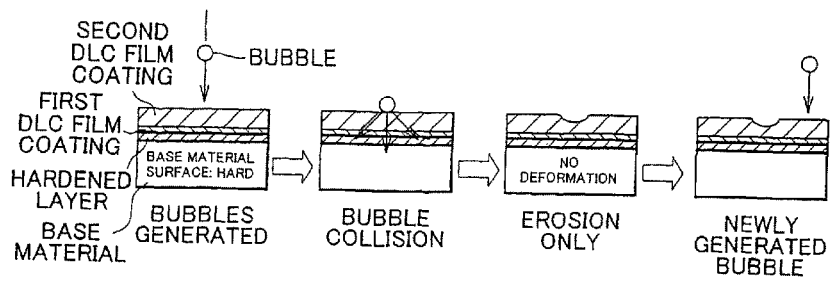

In the case of the test sample of the example 1, the energy of the shock waves is distributed within the film coating, so that the surface waviness is less than that of comparative example 1. This is thought to be because the second amorphous carbon film coating is a group of structures made of granulated amorphous carbon material deposited without any particular orientation, and further because the underlayer formed there beneath is the first amorphous carbon film coating having a different structure. As shown in FIG. 6*c*, it is also thought that if a hardened layer is further formed by nitriding or the like on the surface of the base material, it is possible to further reduce the waviness of the surface.

EXAMPLE 2

A test sample was prepared in the same manner as for example 1. The differences with respect to example 1 were as follows. Before forming the primer film 3 shown in FIG. 1, the base material 2 was pre-heated at 350° C. for 75 minutes. Then Tufftride treatment (salt bath nitriding) was performed at 570° C. for 60 minutes in order to achieve a surface hardness Hv of 1000 and above and a layer thickness of 25 μm, thereby forming a nitrided layer (hardened layer) on the surface of the base material 2. After treating the heated base material was cooled (oil cooling at 120° C. for 5 minutes). After this, in the same manner as for example 1, the primer film 3, the first amorphous carbon film coating 4, and the second amorphous carbon film coating 5 were sequentially formed.

<Surface Hardness Test>

Figure 7:
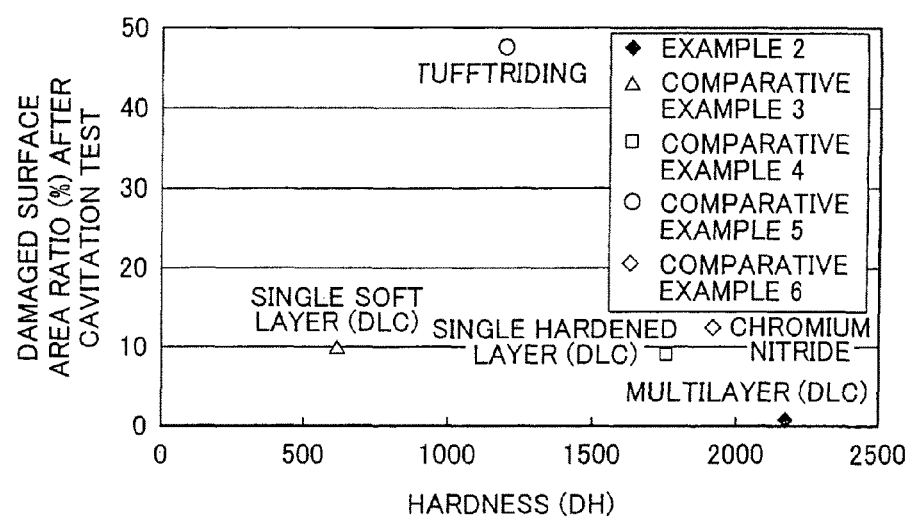
FIG. 7 is a drawing showing the relationship between the damaged surface ratio and the surface hardness of each test sample, for the embodiment 2 and comparative examples 3 to 6 before and after cavitation tests.

The surface hardness of the test sample manufactured as noted above was measured. The results are shown in FIG. 7.

<Cavitation Test and the Evaluation Thereof>

Figure 8:
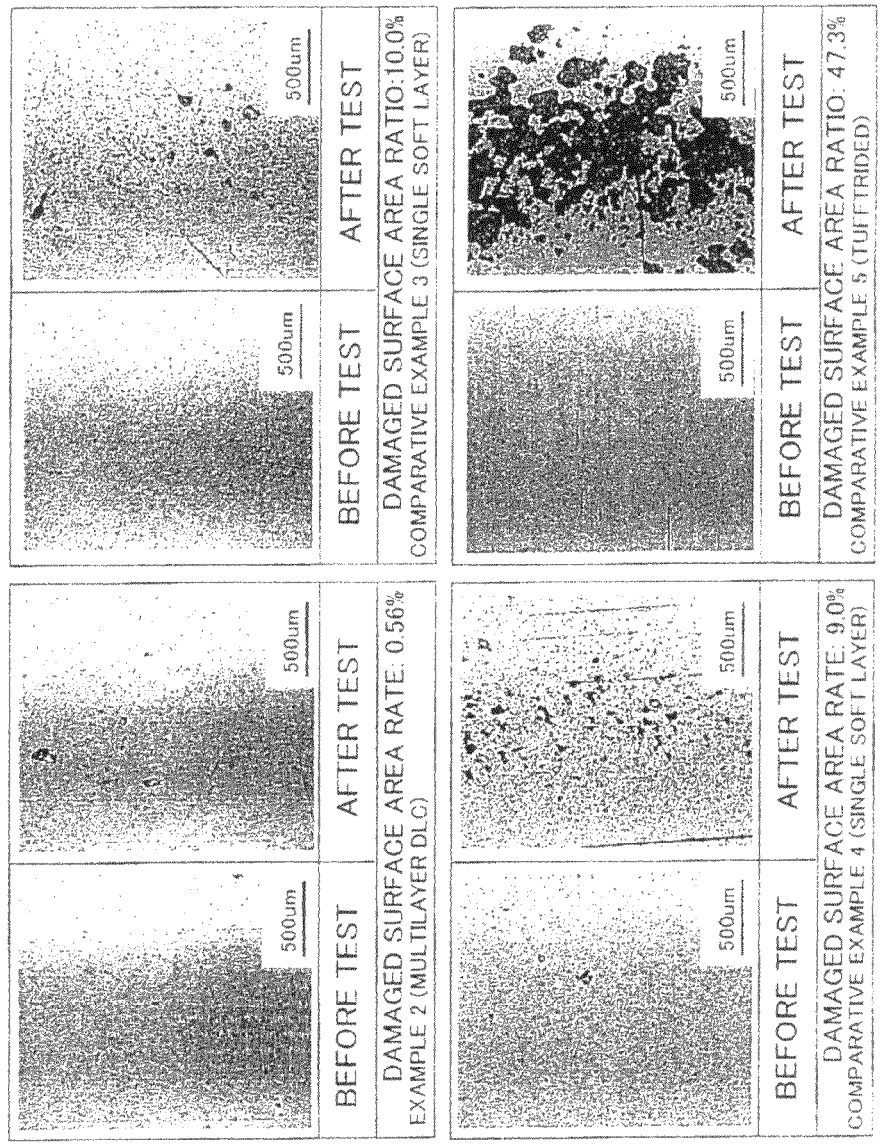
FIG. 8 shows photographs of the surfaces of test sample of embodiment 2 and comparative examples 3 to 5, taken with a metallurgical microscope using cavitation tests.
Figure 9:
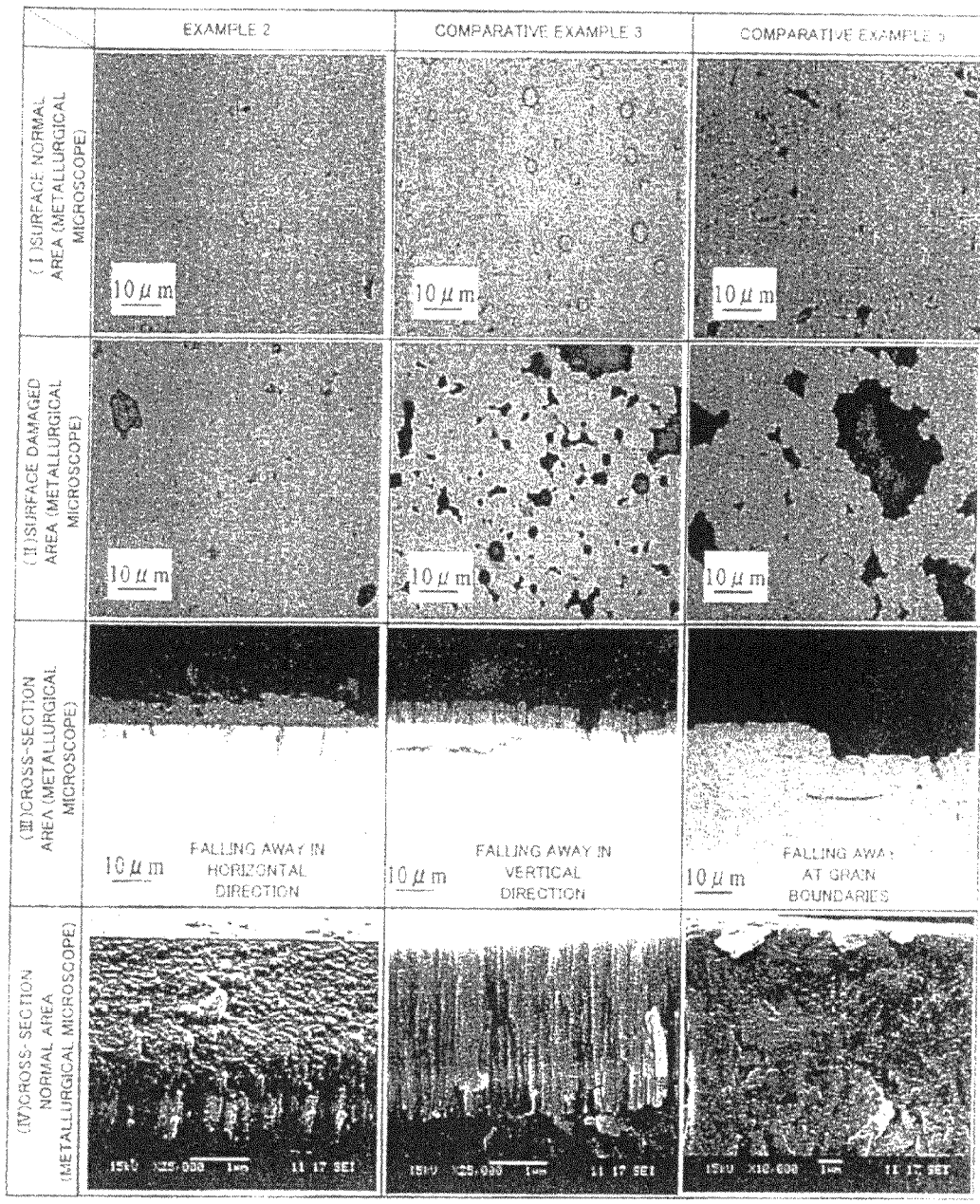
FIG. 9 is shows photographs of the surfaces of embodiment 2 and comparative examples 3 and 5 taken with a metallurgical microscope.

A cavitation test similar to that of example 1 was further performed, and an evaluation was done in the same manner as the example 1. The results are shown in FIG. 7 to FIG. 9. In FIG. 9, the results of observation with a metallurgical microscope are shown in section I for the surface normal area (corresponding to the I part in FIG. 3), in section II for the surface damaged part (corresponding to the II part in FIG. 3), and in section III for the cross-section damaged area (corresponding to the part III in FIG. 3), and the results of observation with an SEM are shown in section IV for the cross-section damaged area (corresponding to the IV part in FIG. 3).

COMPARATIVE EXAMPLE 3

A test sample was prepared with the same base material as in example 2 and, under the same conditions as in example 1, a nitrided layer was formed on the surface of the base material through Tufftride treatment (salt bath nitriding), the surface of the base material being ion bombarded. After a chromium film coating was formed on the surface of the base material by sputtering, an amorphous carbon film coating was formed. That is, the test sample of the example 3 differs from that of example 2 in that no second amorphous carbon film coating was formed. Surface hardness and cavitation tests were performed in the same manner as for example 2. The results are shown in FIG. 7 to FIG. 9.

COMPARATIVE EXAMPLE 4

A test sample was prepared with the same base material as in example 2 and, under the same conditions as in example 2, a nitrided layer was formed on the surface of the base material through Tufftride treatment (salt bath nitriding), the surface of the base material being ion bombarded. After a chromium film coating was formed on the surface of the base material by sputtering, an amorphous carbon film coating was formed while adding tungsten. That is, the test sample of the example 4 differs from that of example 2 in that no second amorphous carbon film coating was formed. Surface hardness and cavitation tests were performed in the same manner as for example 2. The results are shown in FIG. 7 to FIG. 8.

COMPARATIVE EXAMPLE 5

A test sample was prepared with the same base material as in example 2 and, under the same conditions as in example 1, Tufftride treatment conducted. That is, the test sample for the comparative example 5 differed from that of example 2 in that the chromium film coating is formed by sputtering and in that the first and second amorphous carbon film coatings are not formed. Surface hardness and cavitation tests were performed in the same manner as for example 2. The results are shown in FIG. 7 to FIG. 9.

COMPARATIVE EXAMPLE 6

A test sample was prepared with the same base material as in example 2. Then, a nitrided chromium film was formed by arc ion plating, using a chromium target and nitrogen gas with the substrate temperature of 475° C. Surface hardness and cavitation tests were performed in the same manner as for example 2. The results are shown in FIG. 7.

(Results 3: Damaged Surface Area Ratio)

As shown in FIG. 7 and FIG. 8, the surface of sample of example 2 exhibited almost no damage after cavitation. The damaged surface area ratio of example 2 was less than 1%, which was small compared to comparative examples 3 to 6.

(Results 4: Observation of Surface Normal Area)

By the SEM observations shown at IV in FIG. 9, a group of columnar structures were observed in the amorphous carbon film coating formed on the test sample of the example 2 and the comparative example 3 (the first amorphous carbon film coating in the case of the example 2). The group of columnar structures consists of the amorphous carbon materials grown substantially perpendicularly to the surface, with a short side ranging in size from 10 nm to approximately 500 nm. Also, on the test sample of the example 2, a groups of granular structures, which consists of the amorphous carbon materials disposed with no orientation (no growth in a particular direction), were observed the second amorphous carbon film coating, which is formed on the columnar structure group (first amorphous carbon film coating), with diameters in the approximate range of 5 nm to 500 µm. Droplets were observed on the amorphous carbon film coating formed on the test samples of the comparative examples 3 and 4.

(Result 5: Observation of Damaged Parts)

From the observation results of the surface and cross-section using a metallurgical microscope as shown in FIG. 9, it was possible to verify from the test sample of the example 2 that there was a damaged part of on part in which the granular structures of the second amorphous carbon film coating was missing (damage in the horizontal direction in the drawing).

Observation of the normal part of the cross-section of the granular structures of the amorphous carbon film coating of the comparative examples 3 and 4 showed a plurality of droplets. However, an observation of the damaged part of the cross-section showed a plurality of damaged parts having sizes and a distribution condition close to that of the droplets. Along the boundary parts in which columnar structures make contact with one another, there was observed a damaged part (damage in the vertical direction in the drawing) in which part of the columnar structure was missing. Additionally, of the damaged parts locations at which the base material is exposed there were parts observed in which the metallographic structure was missing, along the grain boundaries of the metal of the base material.

Additionally, observation of the surface of damaged parts of the test sample of the comparative example 5 showed depressions of various sizes, all of which had cracks in the vicinity thereof. Observation of the cross-section of the damaged parts showed that, near a part that had a large missing part, cracks along the grain boundaries had grown.

(Observation 3: Damage Mechanism)

Figure 10:
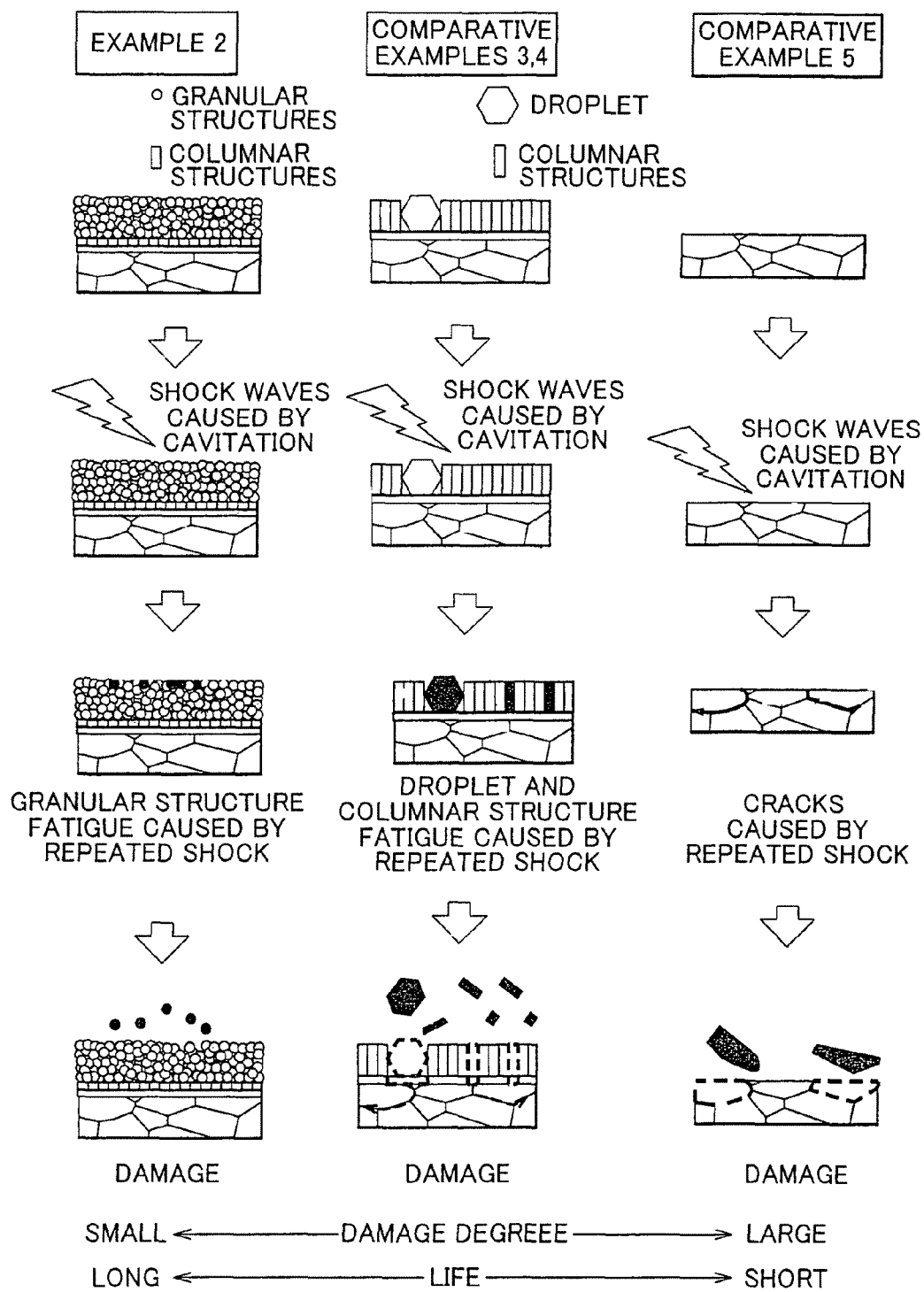
FIG. 10 is a drawing that describes the damage mechanism by cavitation.

From the results 3 to 5, the damage mechanism in the test samples is predicted to be the following, referring to FIG. 10.

As shown in FIG. 10, because of the action of repeated shock waves from cavitation on the surfaces of these test samples, repeated shock (stress) by the shock waves caused fatigue at the surfaces of the test samples. Specifically, these shock waves caused a crack to occur and grow at a weak location of the boundaries between structures in the structure groups of the amorphous carbon film coating, and of the grain boundaries in the surface structure of the metal base material. It can be envisioned that the growth of the crack caused a part of the groups of structures and a part of the metal structure to fall away, leading to damage at the surface.

The second amorphous carbon film coating, which is the surface of the test sample of the example 2 is a group of structures (granular structures) made of granular amorphous carbon material irregularly deposed with no particular orientation, and the granular structures are fine, with an average grain diameter of 5 to 500 mm. For this reason, it is envisioned that, even if this kind of crack grows, the crack does not grow up to the boundary between other granular structures, so that the individual fine granular structures at which cracks have occurred drop away one by one, the result being that the damaged surface area ratio of the test sample surface is small, and it is possible to have cavitation erosion resistance characteristics over a long period of time.

In the case of comparative examples 3 and 4, because the plurality of columnar structures making up the amorphous carbon film coating on the surfaces of these test samples grow perpendicularly from the surface of the base material, a crack that occurs in the boundary between columnar structures on the film surface due to fatigue caused by shock waves grows up to the surface of the base material. It can be envisioned that, as a result, damage occurs to the columnar structures. It can be envisioned in particular that at a location having a droplet, because the boundary between that droplet and the neighboring columnar structure is weak, because the boundary between that droplet and the neighboring columnar structure is weak, the droplet will fall away because of the generation and growth of the crack towards the boundary. It can be envisioned that, as a result, because of falling this kind of columnar structure and droplets, the damaged surface area ratio of the surface of the test sample became large.

Additionally, in the case of the test sample of the comparative example 5, a crack occurs and grows by the grain boundary between metal that are weak amount at the metal surface of the test sample. It can be envisioned that, as a result, because of structure larger than the columnar structures falling away from the surface, there is a further increase in the damaged surface area ratio of the test sample surface. It is also envisioned that, in a case such as those of comparative examples 3 and 4, the same type of phenomenon occurs at a location at which the amorphous carbon film coating is damaged (peels) and the surface of the base material is exposed.

(Observation 4: Relationship Between Damage and Hardness)

Even if the comparative example 3, such as in the comparative example 4, were simply to have the surface hardness of the film coating of the test sample increased, there would not be a decrease in the damaged surface area ratio of comparative example 4, as in FIG. 7. It can be envisioned, as a result, that it is not possible to reduce the damaged surface area ratio of the surface by simply increasing the hardness of the surface. For this reason, it is envisioned that the damaged surface area ratio of this surface, as indicated in Observation 3, is dependent also on the shape, size, and orientation of the these structures.

EXAMPLE 3

The same test sample was manufactured as for example 2, and the same surface hardness and cavitation tests were performed as in the case of example 2. The results are shown in FIG. 11.

COMPARATIVE EXAMPLE 7

The same base material was prepared as for example 2 and, under the same conditions as for example 2, a nitrided layer was formed on the surface of the base material using Tufftride treating (salt bath nitriding), the surface of the base material being ion bombarded. After a chromium film coating was formed by sputtering onto the surface thereof, an amorphous carbon film coating was formed by plasma CVD. That is, the test sample of the comparative example 7 differed from that of example 2 in that there was no first amorphous carbon film coating formed by sputtering. Surface hardness and cavitation tests were performed in the same manner as for example 2. The results are shown in FIG. 11.

(Results 6)

As shown in FIG. 11, the test sample of the example 3 exhibited almost no damage after cavitation. The damaged surface area ratio of the test sample of the example 3 was less than 1%, which was small compared to comparative example 7. The damaged surface area ratio of the comparative example 7 was approximately 70%.

(Observation 5: The Role of the First Amorphous Carbon Film Coating)

As shown in FIG. 7, that the damaged surface area ratio was greater than expected, in spite of the formation of the amorphous carbon film coating made of a plurality of granular structures, because it was not possible to adequately bond an amorphous carbon film coating made of a plurality of granular structures to the base material. That is, it is envisioned that it is possible, such as in example 3, to bond the second amorphous carbon film coating by forming the second amorphous carbon film coating on the surface of the first amorphous carbon film coating.

(Summary)

Results 1 to 6 and Observations 1 to 5 are shown in the table below. In this table, "A", "B", and "C" are relative indices for the film coatings and layers, "A" meaning good, "B" meaning average, and "C" meaning poor.

TABLE 2

|  | Manufacturing Method | Hardness | Adhesion | Structure | Impurities | Cavitation Resistance |
|---|---|---|---|---|---|---|
| Second DLC film coating | PCVD | A | C | Granular structure | None | A |
| First DLC film coating | PVD | B | A | Columnar structure | Metal | B |
| Hardened layer (nitrided layer) | Tufftriding | B | A | Coarse grains | None | C |

In this manner if the cavitation erosion resistance is considered, the second amorphous carbon film coating (second DLC film coating) must be formed on the fluid-contacting surface making contact with the fluid. However, if the bond with the film coating is considered, this second amorphous carbon film coating alone is not sufficient. For this reason, in order to improve the adhesion between the second amorphous carbon film coating and the base material, it is necessary to provide a first amorphous carbon film coating (first DLC film coating) between the second amorphous carbon film coating and the base material. Additionally, in order to reduce the surface waviness caused by cavitation bubbles, it is preferable that a hardened layer be provided on the surface of the base material by, for example, nitriding.

EXAMPLES 4, 5

Figure 12:
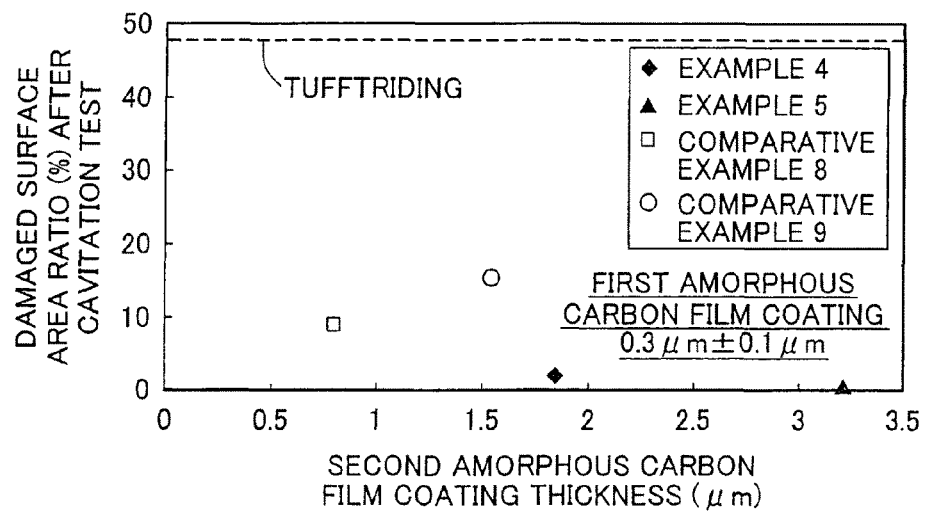
FIG. 12 is a drawing showing the relationship between the film thickness and damaged surface area of the second amorphous carbon film coating of test samples for embodiments 4 and 5 and comparative examples 8 and 9.

Test samples were manufactured as described in example 2. The difference in the test samples for examples 4, 5 is that the thickness of the first amorphous carbon film coating fell in the range of 0.3 μm±0.1 μm, and that the second amorphous carbon film coating had a thickness of 1.85 μm and 3.22 μm, respectively. The same cavitation test was performed as with the example 2, and the damaged surface area ratios were determined. The results are shown in FIG. 12.

COMPARATIVE EXAMPLES 8, 9

Test samples were manufactured as described in example 4. The difference in the test samples for the comparative examples 8, 9 is that second amorphous carbon film coating had a thickness of 0.8 μm and 1.51 μm, respectively. The same cavitation test was performed as with the example 4, and the damaged surface area ratio was determined. The results are shown in FIG. 12.

(Result 7)

Compared to comparative examples 8, 9, examples 4, 5 had almost no damage to the surfaces after the cavitation test.

(Observation 6: The Optimum Second Amorphous Carbon Film Coating)

As a result, it is believed that the damaged surface area ratio decreases and the cavitation erosion resistance improves with an increase in the thickness of the second amorphous carbon film coating. However, from the damaged surface area ratio of the test samples of the comparative examples 8, 9 it is thought that sufficient cavitation erosion resistance is achieved even with comparative examples 8, 9. In contrast, if the film thickness of the second amorphous carbon film coating is excessive (thicker than 4.5 μm) when this second amorphous carbon film coating is formed, there is a possibility that film peeling occurs caused by compression stressing of this amorphous carbon film coating.

It is thought that a sufficient cavitation erosion resistance effect is achieved if the film thickness of the second amorphous carbon film coating is at least in the range 0.5 to 4.5 μm. Additionally, if the minimum film thickness, such as in the examples 4, 5 is 2.0 μm, that is if the thickness is 2.0 to 4.5 μm, it is thought that there is a further improvement in the cavitation erosion resistance characteristics.

EXAMPLE 6

Figure 13:
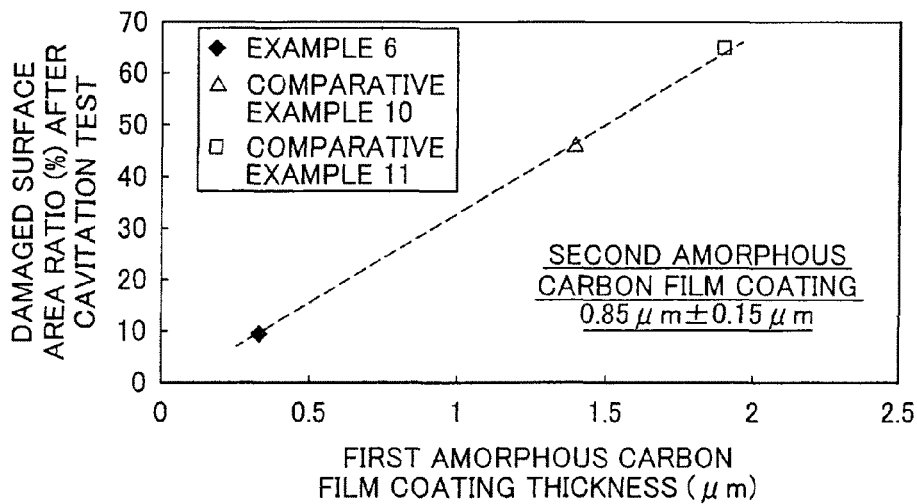
FIG. 13 is a drawing showing the relationship between the film thickness and damaged surface area of the first amorphous carbon film coating of test samples for embodiment 6 and comparative examples 10 and 11.

The same test sample was manufactured as for the example 2. The difference of the test sample of the example 6 with respect to the example 2 is that the thickness of the first amorphous carbon film coating is 0.33 μm, and that the second amorphous carbon film coating is formed so that the film thickness fell in the range 0.85 μm±0.15 μm. The same cavitation test was performed as for the example 2, and the damaged surface area ratio was determined. The results are shown in FIG. 13.

COMPARATIVE EXAMPLES 10, 11

The same test samples were manufactured as for the example 2. The difference of the test samples of comparative examples 10 and 11 with respect to the example 2 is that the thickness of the first amorphous carbon film coating thickness is 1.4 μm and 1.99 μm, respectively. The same cavitation test was performed as for the example 2, and the damaged surface area ratio was determined. The results are shown in FIG. 13.
(Results 8)
As shown in FIG. 13, the damaged surface area ratio became progressively larger in the sequence of example 6, comparative example 10, and comparative example 11.
(Observation 7: The Optimum First Amorphous Carbon Film Coating)
From the Results 8, a thinner first amorphous carbon film coating has better adhesion with respect to the cavitation shock waves. From the standpoint of film forming, it is possible to achieve uniform forming of the first amorphous carbon film coating within the minimum film thickness range of 0.2 to 0.4 μm.

The member for cavitation erosion resistance according to the present invention may be used locations in automotive equipment and parts, such as shown in FIG. 14, in which the material comes into contact with an operating oil or the like.

The invention claimed is:

1. A member resistant to erosion by cavitation in which the member contacts with fluid, comprising:
    a base material, wherein a surface of the base material is hardened;
    an intermediate film including at least one element selected from the group of Cr, Ti, W, Ni, Si, and Al, provided on a surface of the base material;
    a gradient film provided on a surface of the intermediate film;
    a first amorphous carbon film coating that comprises a plurality of columnar structures on a surface of the gradient film; and
    a second amorphous carbon film coating that comprises a plurality of granular structures deposited onto a surface of the first amorphous carbon film coating without orientation,
    wherein in the gradient film, the at least one element of the intermediate film is added to an amorphous carbon material so that a composition of the gradient film changes toward a composition of the at least one element constituting the intermediate film in a direction from the first amorphous carbon film coating to the intermediate film.

2. The member according to claim 1, wherein the average grain diameter of the granular structures is 5 to 500 nm.

3. The member according to claim 1, wherein
    the base material is made of a ferrous material, and the hardened surface of the base material is a layer selected from the group consisting of a nitrided layer, a carbonitrided layer, and a oxynitrided layer.

4. The member according to claim 1, wherein the first amorphous carbon film coating has a thickness of 0.2 to 0.4 μm.

5. The member according to claim 1, wherein the second amorphous carbon film coating has a thickness of 0.5 to 4.5 μm.

6. A method of manufacturing a member resistant to erosion by cavitation in which the member contacts with fluid, and an amorphous carbon film coating is formed on a surface of a base material, comprising:
    forming a hardened layer by hardening the surface of the base material;
    forming an intermediate film including at least one element selected from the group of Cr, Ti, W, Ni, Si, and Al, on a surface of the hardened layer;
    forming a gradient film on a surface of the intermediate film;
    forming a first amorphous carbon film coating comprising a plurality of columnar structures on a surface of the gradient film, by a physical vapor deposition method; and
    forming a second amorphous carbon film coating comprising a plurality of granular structures deposited on a surface of the first amorphous carbon film coating without orientation, by a plasma chemical vapor deposition method,
    wherein in the gradient film, the at least one element of the intermediate film is added to an amorphous carbon material so that a composition of the gradient film changes toward a composition of the at least one element constituting the intermediate film in a direction from the first amorphous carbon film coating to the intermediate film.

7. The method according to claim 6, wherein
    the average grain diameter of the granular structures in the second amorphous carbon film coating is 5 to 500 nm.

8. The method according to claim 6, further comprising:
    hardening the surface of the base material before forming the first amorphous carbon film coating.

9. The method according to claim 8, wherein
    the surface of the base material includes a ferrous material, and the hardening of the surface of the base material is a process selected from the group consisting of nitridation, carbonitridation, and oxynitridation.

10. The method according to claim 6, wherein the first amorphous carbon film coating has a thickness of 0.2 to 0.4 μm.

11. The method according to claim 6, wherein the second amorphous carbon film coating has a thickness of 0.5 to 4.5 μm.

* * * * *